(12) United States Patent
Degrenne et al.

(10) Patent No.: US 10,705,133 B2
(45) Date of Patent: Jul. 7, 2020

(54) METHOD AND DEVICE FOR ESTIMATING LEVEL OF DAMAGE OR LIFETIME EXPECTATION OF POWER SEMICONDUCTOR MODULE

(71) Applicant: MITSUBISHI ELECTRIC CORPORATION, Tokyo (JP)

(72) Inventors: Nicolas Degrenne, Rennes (FR); Stefan Mollov, Rennes (FR)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 67 days.

(21) Appl. No.: 15/779,774

(22) PCT Filed: Jan. 26, 2017

(86) PCT No.: PCT/JP2017/003679
§ 371 (c)(1),
(2) Date: May 29, 2018

(87) PCT Pub. No.: WO2017/135333
PCT Pub. Date: Aug. 10, 2017

(65) Prior Publication Data
US 2019/0285689 A1    Sep. 19, 2019

(30) Foreign Application Priority Data

Feb. 3, 2016  (EP) ..................... 16154094

(51) Int. Cl.
*G01R 31/26*  (2020.01)
*G01R 31/28*  (2006.01)
(Continued)

(52) U.S. Cl.
CPC ........... *G01R 31/2642* (2013.01); *G01K 1/14* (2013.01); *G01R 31/007* (2013.01);
(Continued)

(58) Field of Classification Search
CPC .............. G01R 31/2642; G01R 31/007; G01R 31/2619; G01R 31/2848; G01K 1/14
See application file for complete search history.

(56) References Cited

U.S. PATENT DOCUMENTS 5,528,446 A     6/1996  Sankaran et al.
2012/0323539 A1* 12/2012  Chen .................. G06F 17/5036
                                                      703/2
(Continued)

FOREIGN PATENT DOCUMENTS

CN         104380126 A     2/2015
WO      WO 2013/187207     12/2013

OTHER PUBLICATIONS

Chen et al., "Real-Time Temperature Estimation for Power MOSFETs Considering Thermal Aging Effects." IEEE Transactions on Device and Materials Reliability, vol. 14, No. 1, Mar. 2014, pp. 220-228.
(Continued)

*Primary Examiner* — Tung X Nguyen
*Assistant Examiner* — Feba Pothen
(74) *Attorney, Agent, or Firm* — Birch, Stewart, Kolasch & Birch, LLP

(57) ABSTRACT

The present invention concerns a method and a device for estimating a level of damage or a lifetime expectation of a power semiconductor module comprising at least one die that is mechanically, thermally, and electrically attached to a substrate, composed of plural layers of different materials. The invention:
  obtains power losses of the power semiconductor module,
  obtains the temperature in at least two different locations of the power semiconductor module,
  estimates a thermal model between the at least two different locations of the power semiconductor module using the determined power losses and the obtained temperatures,
(Continued)

determines if a notification indicating the level of damage or the lifetime expectation has to be performed according to the estimated thermal model and a reference thermal model.

notifies the level and location of damage or the lifetime expectation if the determining step determines that the notification has to be performed.

8 Claims, 5 Drawing Sheets

(51) Int. Cl.
*G01R 31/00* (2006.01)
*G01K 1/14* (2006.01)
(52) U.S. Cl.
CPC ..... *G01R 31/2619* (2013.01); *G01R 31/2848* (2013.01); *G01R 31/2849* (2013.01)

(56) References Cited

U.S. PATENT DOCUMENTS

2014/0103937 A1* 4/2014 Khan ................ G01R 31/40
324/509
2014/0285131 A1* 9/2014 Sasaki ................ H02P 29/68
318/490

OTHER PUBLICATIONS

Poller et al., "Influence of thermal cross-couplings on power cycling lifetime of IGBT power modules," CIPS 2012, Mar. 6-8, 2012, Nuremberg / Germany, Paper 05.4, 6 pages.

Wang et al., "IGBT Condition Monitoring with System Identification Methods," ITEC Asia-Pacific 2014 1569952339, pp. 1-6.

First Notification of Office Action issued in corresponding Chinese Application No. 201780008461.5 dated Feb. 3, 2020.

* cited by examiner

METHOD AND DEVICE FOR ESTIMATING LEVEL OF DAMAGE OR LIFETIME EXPECTATION OF POWER SEMICONDUCTOR MODULE

TECHNICAL FIELD

The present invention relates generally to a method and device for estimating a level of damage or a lifetime expectation of a power semiconductor module comprising at least one die that is mechanically, thermally, and electrically attached to a substrate.

BACKGROUND ART

In the field of Power Electronics, some components are known as vulnerable, power semiconductor modules are one of them.

In power semiconductor modules, one or several power semiconductor dies are mechanically, thermally, and electrically attached to a substrate. Because of thermal expansion mismatch between the different materials in the structure, like for example silicon, silicon carbide, gallium nitride, solder, sintering paste, copper, ceramic, aluminium, mechanical stress is created. The mechanical stress may affect the structure of the power semiconductor modules like for example, cracks, voids, delaminations of materials and/or interfaces and may lead to the failure of the power semiconductor module.

For example, when the electric assembly is used in electrical cars, it is important to identify on which vehicles the electric assembly has reached a significant damage level. The constructor can warn the customer and propose a control/exchange of the near-to-be-damaged electric assembly. This service provides an increased quality control for the fleet of vehicles.

The same arises for a fleet of offshore windmills where the maintenance costs are prohibitive and access is limited.

SUMMARY OF INVENTION

The present invention aims at estimating the level of damage of an electric assembly that is an important feature for the constructor and/or customer.

To that end, the present invention concerns a method for estimating a level of damage or a lifetime expectation of a power semiconductor module comprising at least one die that is mechanically, thermally, and electrically attached to a substrate, composed of plural layers of different materials, characterized in that the method comprises the steps of:
  obtaining power losses of the power semiconductor module,
  obtaining the temperature in at least two different locations of the power semiconductor module,
  estimating a thermal model between the at least two different locations of the power semiconductor module using the determined power losses and the obtained temperatures,
  determining if a notification indicating the level of damage or the lifetime expectation has to be performed according to the estimated thermal model and a reference thermal model,
  notifying the level and location of damage or the lifetime expectation if the determining step determines that the notification has to be performed.

The present invention concerns also a device for estimating a level of damage or a lifetime expectation of a power semiconductor module comprising at least one die that is mechanically, thermally, and electrically attached to a substrate, composed of plural layers of different materials, characterized in that the device comprises:
  means for obtaining power losses of the power semiconductor module,
  means for obtaining the temperature in at least two different locations of the power semiconductor module,
  means for estimating a thermal model between the at least two different locations of the power semiconductor module using the determined power losses and the obtained temperatures,
  means for determining if a notification indicating the level of damage or the lifetime expectation has to be performed according to the estimated thermal model and a reference thermal model,
  means for notifying the level and location of damage or the lifetime expectation if the determining step determines that the notification has to be performed.

Thus, by estimating the state of health with on-line degradation localization based on dynamic updating of thermal model provides an important feature for the constructor and/or customer and allows for keeping the cost of this feature low by requiring a limited amount of sensors. In addition, the dynamic updating allows harvesting a maximum of information during the normal operation of the power semiconductor module, so that not only damage can be identified and quantified, but its localization in the power semiconductor module can be determined.

Indeed, when the product is a power semiconductor module applied to traction application, by identifying on which train the power semiconductor module has reached a significant damage level, the customer can be alerted and control/exchange of the near-to-be-damaged power semiconductor module can be effectuated. This service provides an increased quality control for the fleet of train. Another example is a fleet of offshore windmills where the maintenance costs are prohibitive. By identifying the damage level at different localisations within the power semiconductor module, the maintenance operations can be adapted, and/or more precise information can be feedback to the manufacturer for the design of next generation power semiconductor modules.

According to a particular feature, the locations at which the temperatures are obtained are at least a baseplate and the junction of at least one die.

Thus, the degradations in the interface layers between the die and the baseplate can be detected. In addition, the junction temperature can be measured at low cost using a Thermal Sensitive Electrical Parameter (TSEP) of the die. In addition, the baseplate temperature can be measured using a low-cost sensor.

According to a particular feature, the thermal model is a Cauer model.

Thus, the location of the degradation can be identified. Because the parameters of the Cauer thermal model can represent the thermal resistances and capacitances of the different layers of the power module assembly, a modification in one or several of these parameters provides an indication on the degradation of the corresponding layer.

According to a particular feature, the method comprises further step of determining the instant when the estimating of the level of damage or of the lifetime expectation of the power semiconductor module is performed, the instant determining step is periodical or when a product comprising the power semiconductor module is turned-on, or at a variable periodicity which depends on a previously determined lifetime expectation or when the electric power provided by the power semiconductor module changes abruptly or according to temperature.

Thus, the estimation of level of damage can be performed when it is most necessary, with higher accuracy and at lower processing cost.

According to a particular feature, the obtaining of power losses and temperatures steps is performed iteratively during a given duration and the method comprises further steps of:
  checking if the power losses obtained during the given duration are suitable for the thermal model estimation,
  executing the thermal model estimation only if the power losses obtained during the given duration are suitable for the thermal model estimation.

Thus, the thermal model is estimated with a higher fidelity and the estimation of level of damage is performed with higher accuracy.

According to a particular feature, the estimating of the thermal model is performed by:
  determining an estimation error,
  filtering the estimation error,
  determining a norm of the estimation error,
  determining a parameter vector comprising values of the thermal model by selecting the parameter vector which minimizes the norm of the estimation error.

Thus, the parameters of the thermal model can be identified with high accuracy.

According to a particular feature, the reference model is determined during the commissioning of the power semiconductor module or by an initial identification at the beginning of the life of the power semiconductor module.

Thus, the reference thermal model is specific to the concerned power semiconductor module and manufacturing process differences between power semiconductor modules do not affect the accuracy of the estimation of level of damage.

According to a particular feature, the determining if a notification indicating the level of damage or the lifetime expectation has to be performed according to the estimated thermal model and the reference thermal model is performed by:
  evaluating the error between the reference parameter values and the determined parameter values,
  filtering the error,
  converting the filtered error into one or several distances which is or are metrics for a deviation from a value of the reference model.

Thus, the degradation of the power semiconductor module can be detected with high accuracy and fidelity, and the location of the degradation can be identified.

According to a particular feature, the distances are extrapolated in order to define a time wherein the extrapolated distance is equal to a threshold value.

Thus, the remaining useful life of the power semiconductor module can be predicted, and the power semiconductor module can be replaced before its failure (just-in time maintenance), at a lower cost. In addition, a higher level of safety is ensured.

According to a particular feature, the level of damage of the power semiconductor module or the lifetime expectation of the power semiconductor module is notified.

Thus, the user of the power semiconductor module can take actions to replace the power semiconductor module at lower cost, and thus decrease the life cycle cost. And the user of the power semiconductor module can take actions to limit the ageing of the power semiconductor module, and thus increase its lifetime. The manufacturer of the power semiconductor module can take actions to improve the next generation of power semiconductor modules.

The characteristics of the invention will emerge more clearly from a reading of the following description of example embodiments, the said description being produced with reference to the accompanying drawings, among which:

DESCRIPTION OF EMBODIMENTS

Figure 1:
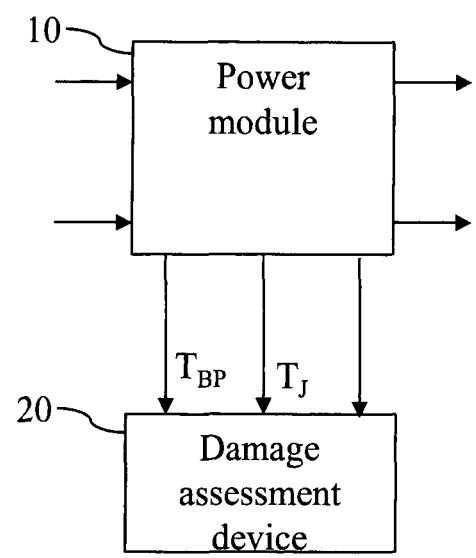
FIG. 1 represents an example of an architecture of a system for determining the damage assessment of a power semiconductor module according to the present invention.

FIG. 1 represents an example of an architecture of a system for determining the damage assessment of a power semiconductor module according to the present invention.

The system for determining the damage assessment of a power semiconductor module is for example implemented in an electric car or in a train or in an offshore windmill.

A damage assessment device 20 is used for determining the level of damage of at least one power semiconductor module.

In the example of FIG. 1, the damage assessment device 20 is used for determining the level of damage of a power semiconductor module 10.

The damage assessment device 20 evaluates the state of health of the power semiconductor module 10 containing one or more power semiconductor die. The damage assessment device 20 performs on-line degradation localization based on dynamic updating of a thermal model. In other terms, the thermal model of the power semiconductor module 10 is updated in real-time, and the evolution of the model is used as an indicator of structural change within the power semiconductor module 10. The thermal model is a transfer function with inputs the power loss Ploss in the power semiconductor module 10, the temperature in at least one location in the power semiconductor module 10 like the baseplate temperature $T_{BP}$, and with an output temperature $T_J$ in at least one other location, like one die of the power semiconductor module 10. The thermal model is updated during on-line operation.

The damage assessment device 20 may use other parameters like for example input and output power of the power semiconductor module 10 in order to evaluate the level of power losses in the power semiconductor module 10.

According to the invention, the damage assessment device 20:

obtains power losses of the power semiconductor module, obtains the temperature in at least two different locations of the power semiconductor module, estimates a thermal model between the at least two different locations of the power semiconductor module using the determined power losses and the obtained temperatures, determines if a notification indicating the level of damage or the lifetime expectation has to be performed according to the estimated thermal model and a reference thermal model, notifies the level of damage or the lifetime expectation if the determining step determines that the notification has to be performed.

Figure 2:
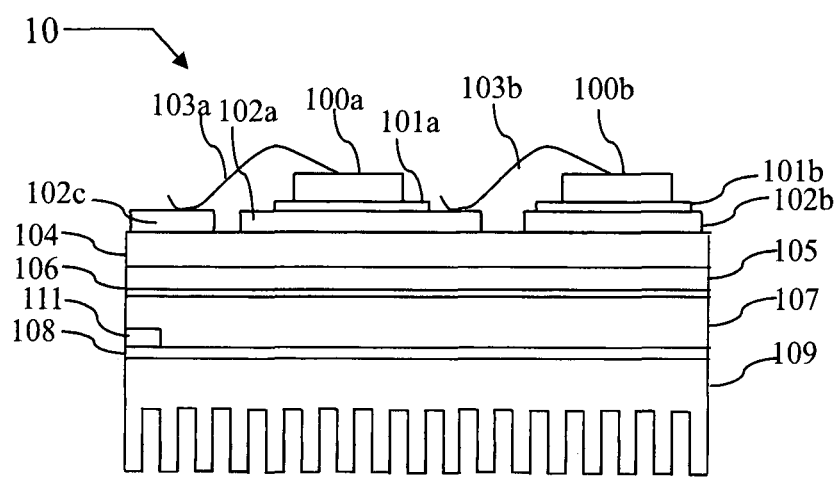
FIG. 2 represents an example of the architecture of a power semiconductor module according to the present invention.

FIG. 2 represents an example of the architecture of a power semiconductor module according to the present invention.

The power semiconductor module 10 comprises two dies noted 100a and 100b. The die 100a is connected to a copper layer 102a through a solder layer 101a and to another copper layer 102c through a wire bond 103a. The die 100b is connected to a copper layer 102b through a solder layer 101b and to the copper layer 102a through a wire bond 103b. The copper layers 102 are on a substrate 104, like for example a ceramic substrate.

A copper layer 105 is on the bottom of the substrate 104. The copper layers 102, 105 and the substrate 104 form a Direct Bonded Copper (DBC).

The DBC is soldered on a baseplate 107 which is fixed on a Heat sink 109 through a thermal interface 108.

A temperature sensor 111 is fixed on the baseplate 107 and provides the temperature $T_{BP}$.

Figure 3:
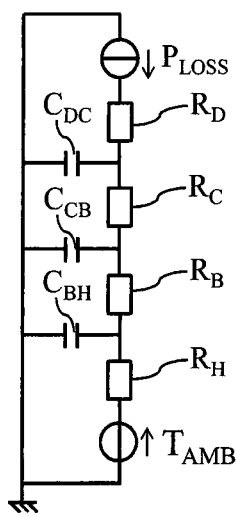
FIG. 3 represents an example of a thermal model of a power semiconductor module.

FIG. 3 represents an example of a thermal model of a power semiconductor module.

The thermal model is for example represented by a Cauer network and is identified fully based on thermal transient responses.

The thermal model shown in FIG. 3 is composed of for resistors $R_D$, $R_C$, $R_B$ and $R_H$, three capacitors $C_{DC}$ $C_{CB}$ and $C_{BH}$, a voltage generator $T_{AMB}$ and a current generator $P_{LOSS}$.

The resistance $R_D$ represents the thermal resistance of the die 100, the resistance $R_C$ represents the thermal resistance of the ceramic substrate, the resistance $R_B$ represents the thermal resistance of the baseplate 107 and the resistance $R_H$ represents the thermal resistance of the Heat sink.

The capacitor $C_{DC}$ represents the thermal capacitance of the die, the capacitor $C_{CB}$ represents the thermal capacitance of the ceramic substrate and the capacitor $C_{BH}$ represents the thermal capacitance of the baseplate.

Figure 4:
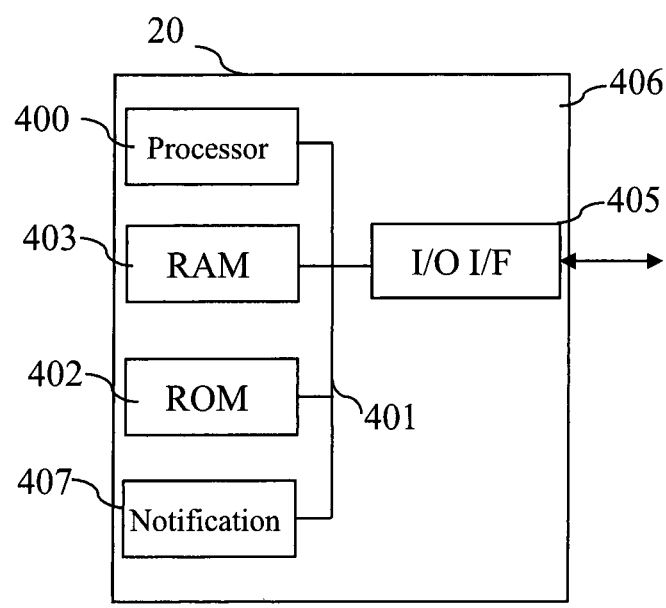
FIG. 4 represents an example of a device for estimating the level of damage of a power semiconductor module according to the present invention.

FIG. 4 represents an example of a device for estimating the level of damage of a power semiconductor module according to the present invention.

Figure 5:
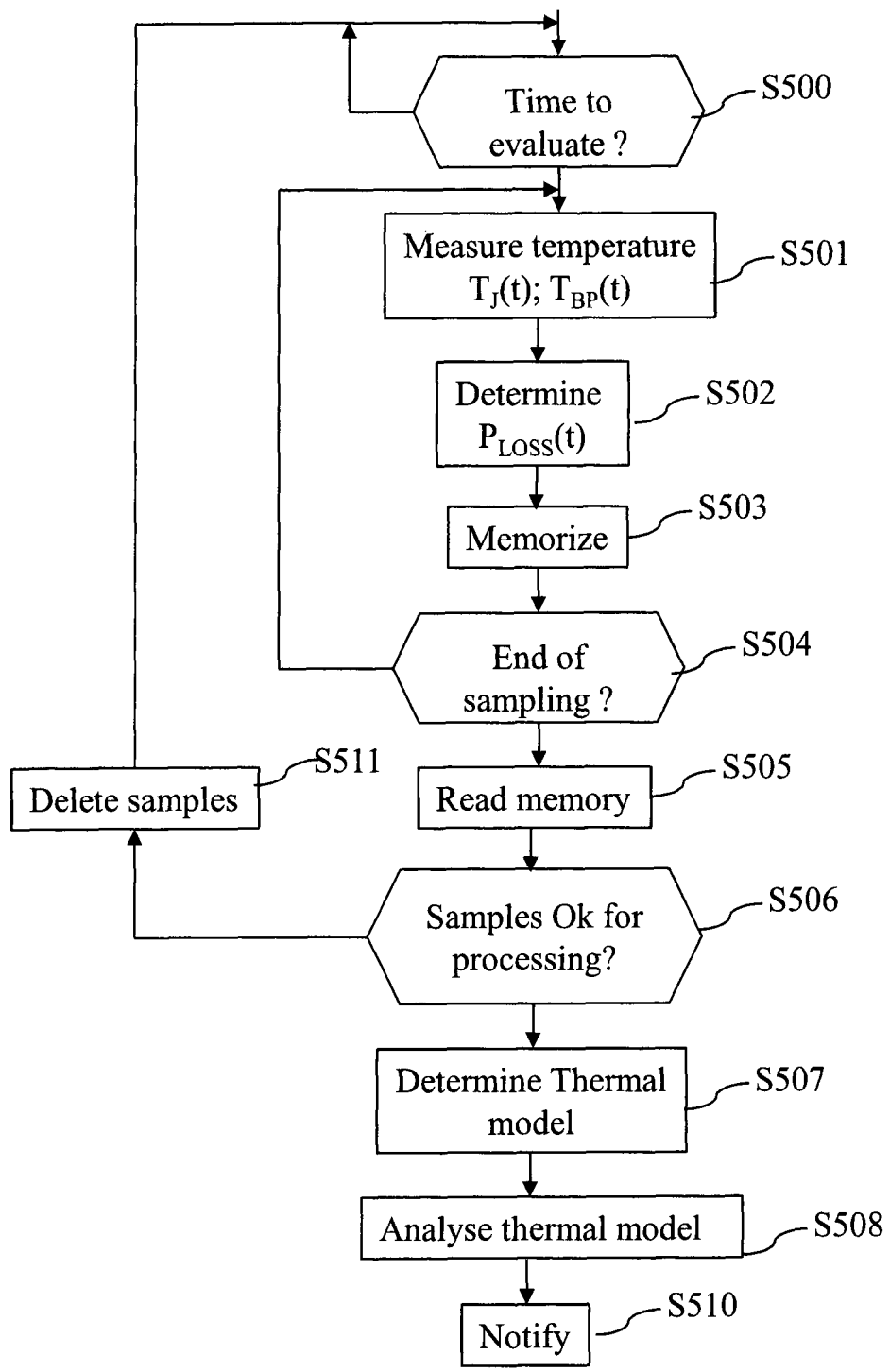
FIG. 5 represents an example of an algorithm for determining the damage assessment level of a power semiconductor module according to the present invention.

The damage assessment device 20 has, for example, an architecture based on components connected together by a bus 401 and a processor 400 controlled by a program as disclosed in FIG. 5.

The bus 401 links the processor 400 to a read only memory ROM 402, a random access memory RAM 403, an input output I/O IF interface 405 and a notification mean 407.

The memory 403 contains registers intended to receive variables and the instructions of the program related to the algorithm as disclosed in FIG. 5.

The processor 400 receives through the input output I/O IF 405, for example sensed temperatures, the electric power at the input and at the output of the power semiconductor module 10.

The processor 400 may command the notification mean 407 in order to notify the level of damage of the power semiconductor module 10 or may command the notification mean 407 in order to notify a lifetime expectation of the power semiconductor module 10.

The read-only memory, or possibly a Flash memory 402 contains instructions of the program related to the algorithm as disclosed in FIG. 5, when the damage assessment device 20 is powered on, to the random access memory 403.

The damage assessment device 20 may be implemented in software by execution of a set of instructions or program by a programmable computing machine, such as a PC (Personal Computer), a DSP (Digital Signal Processor) or a microcontroller; or else implemented in hardware by a machine or a dedicated component, such as an FPGA (Field-Programmable Gate Array) or an ASIC (Application-Specific Integrated Circuit).

In other words, the damage assessment device 20 includes circuitry, or a device including circuitry, causing the damage assessment device 20 to perform the program related to the algorithm as disclosed in FIG. 5.

FIG. 5 represents an example of an algorithm for determining the damage assessment level of a power semiconductor module according to the present invention.

The present algorithm is disclosed in an example wherein it is executed by the processor 400.

At step S500, the processor 400 checks if it is time to evaluate a damage assessment level of the power semiconductor module 10.

Because the thermal model changes slowly with time, the evaluation is performed at discrete moments in time. For example, the instant can be chosen at fixed intervals of time, for example every day, every week, or every month, or at fixed interval of cycles, for example after 1 day of continuous operation.

For example, the instant can be chosen at turn-on or at turn-off of the product comprising the power semiconductor module 10, for example before each departure if the power semiconductor module is embedded in a train or a car.

For example, the instant can be chosen at intervals defined by the estimation of the state-of-health of the power semiconductor module 10, so that when the power semiconductor module 10 approaches end-of-life, the evaluation is performed more frequently.

For example, the instant can be chosen at times when the load current changes abruptly so that the power loss signal exhibits large frequency content, for example when the load current is modified from a certain value to zero, corresponding to the end of an accelerating phase in a train application.

Because the thermal model changes with temperature as thermal resistances and capacitances are temperature dependent, the instant can be selected based on the ambient temperature and the estimated temperature within the power semiconductor module 10.

If it is time to evaluate a damage assessment level of the power semiconductor module 20, the processor 400 moves to step S501. Otherwise, the processor 400 returns to step S500.

At step S501, the processor 400 commands the input output I/O IF interface 405 in order to obtain measurements.

The processor 400 obtains the temperature in at least one location in the power semiconductor module 10 like the die temperature $T_J$ and obtains a temperature $T_{BP}$ in at least one other location, like in the baseplate of the power semiconductor module 10.

One location can typically be close to the die, for example the virtual junction temperature of the die itself, and the other location can typically be far from the die, for example on the substrate, on the base-plate, or on the heat-sink. The thermal model is valid for the power assembly structure in between these two locations.

Temperature measure, typically at the virtual junction, within the die itself, can either be performed with a dedicated sensor such as an NTC sensor or one or several diodes positioned on the surface of the die or by measuring a Temperature-Sensitive Electrical Parameter (TSEP) of the die itself, such as the gate threshold voltage Vth, the duration of the gate charge turn-ON, the peak gate current Igp, or any other temperature-dependent electrical parameter. In the case of temperature estimation at high current with the collector to emitter voltage (Vce) for a bipolar semiconductor, the drain to source voltage (Vds) for an unipolar semiconductor, the temperature estimation may be biased by a potential degradation of the electrical path, and the measure must be compensated to account for the junction temperature only.

Temperature measure of the other location is typically performed with a dedicated sensor such as an NTC sensor.

At next step S502, the processor 400 determines the power loss Ploss of the power semiconductor module 10.

The power loss Ploss is the sum of the switching loss and conduction loss. For example, the conduction losses are, for a bipolar transistor, equal to Vce*Ice during transistor conduction. Vce is the voltage between the collector and the emitter of the transistor and Ice is the current going through the collector and emitter during conduction.

For example, the switching losses during a switching period is the product between the die switching frequency and the sum of the turn-OFF and turn-ON energy losses.

Vce, Ice may be measured or the difference between the input power and the output power of the power semiconductor module 10 is calculated.

The power losses may be determined for example by measuring load current, DC voltage, collector-emitter voltage during conduction, junction temperature.

The power losses may be determined for example by estimating data, such as the junction temperature estimated by the updated thermal model. In another embodiment, the junction temperature used for the power loss calculation is a measured temperature, corrected with a filter that uses the estimation of the thermal model.

The power losses may be determined for example by operating the power semiconductor module in predetermined conditions. For example frequency is typically a parameter that is a predetermined condition.

The power losses may be determined for example using data available in look-up tables, for example look-up tables of switching energy losses as a function of voltage and current. These look-up tables are stored in the ROM memory 402.

At next step S503, the processor 500 memorizes the results of steps S501 and S502.

A next step S504, the processor 400 determines if it is time to interrupt the data collecting steps.

The data collecting step has a duration that exceeds the slowest time constants of the thermal model, typically more than a minute.

If it is time to interrupt the data collecting steps, the processor 400 moves to step S505. Otherwise, the processor 400 returns to step S501.

At step. S505, the processor reads in memory the data memorized at step S503.

At step S506, the processor 500 checks if the data collected are suitable for updating the thermal model. For example, the frequency content of the power loss signal can be evaluated with a discrete Fourier transform. If the frequency content comprises plural frequencies, the data collected are suitable for updating the thermal model. In another example, the amplitude of power loss variations is evaluated. If the amplitude variation is important, for example, the amplitude variation is ten times the minimum value, the data collected are suitable for updating the thermal model.

Figure 6A:
FIG. 6a represents data used by the device for estimating the level of damage of a power semiconductor module according to the present invention.
Figure 6B:
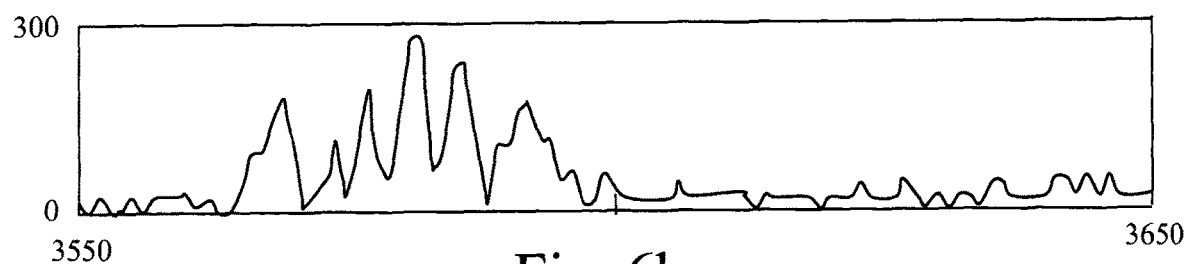
FIG. 6b represents data used by the device for estimating the level of damage of a power semiconductor module according to the present invention.
Figure 6C:
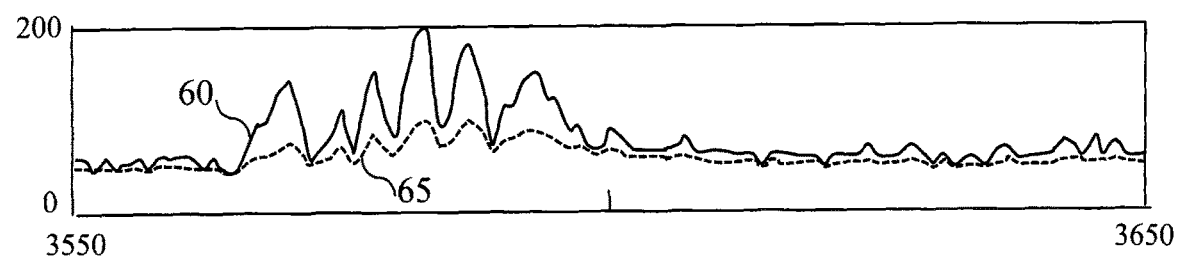
FIG. 6c represents data used by the device for estimating the level of damage of a power semiconductor module according to the present invention.

An example of data collected is disclosed in FIGS. 6a, 6b and 6c.

FIGS. 6a, 6b and 6c represent data used by the device for estimating the level of damage of a power semiconductor module according to the present invention.

FIG. 6a represents speed measurements during a collecting step.

The horizontal axis represents the time expressed in second and the vertical axis represents the speed in kilometer per hour of a product, i.e. an Electric Vehicle EV comprises the device for determining the damage assessment of a power semiconductor module.

When the electric vehicle brakes or accelerates, the variations of the power losses are important as shown in FIG. 6b.

FIG. 6b represents power losses variation during a collecting step.

The horizontal axis represents the time expressed in second and the vertical axis represents the power losses expressed in Watt.

Important variations of power losses generate important variations of measured temperatures as shown in FIG. 6c.

FIG. 6c represents temperature variation during a collecting step.

The horizontal axis represents the time expressed in second and the vertical axis represents the temperature expressed in degree Celsius.

The curve noted 60 represents the variations of the die temperature and the curve noted 65 represents the baseplate temperature.

According to a particular feature, at that step, the processor 400 filters the data in order to remove noise. For example, the processor 400 uses the Kalman filter that is optimum for a Gaussian noise. The filtering is performed using information on the thermal model, on the power losses, and on the temperature on the other location to predict the state of the thermal model and predict the junction temperature. The predicted junction temperature is compared to the measured temperature to correct the state of the thermal model and compute the corrected value of the junction temperature. The corrected value of measured junction is thus less noisy than the original data.

If the data collected are suitable for updating the thermal model, the processor 400 moves to step S507. Otherwise, the processor 400 moves to step S511. At step S511, the processor 400 deletes the data memorized at step S503 and moves to step S500.

At step S507, the processor 400 determines a thermal model from the data previously filtered or not.

The thermal model is a so-called Foster model, or a so-called Cauer model, or more generally, any transfer function which input X(t) is the power loss Ploss(t) and at least one temperature, typically the temperature at a distant location of the die, and which output is an estimate Yest(t). Ymes(t) is at least one measured temperature, filtered or not, at the junction or at an interface in the thermal path between the junction and the distant location of the die. The thermal model structure M is pre-defined with a certain number of poles and zeros corresponding to e.g. a Foster model or a Cauer model of a pre-defined number of stages. The thermal model structure M($\theta$) is parameterized using the parameter vector $\theta$. Parameters have a pre-defined initial value, and can represent e.g. values of thermal resistances, thermal capacitances or thermal time constants. Typically, in the case of a Cauer model, to reduce the number of parameters, thermal capacitances may be constant pre-defined values, whereas thermal resistances of critical interfaces are parameters that can be updated.

If the semiconductor power module is composed of several dies, the method can be applied to one, several, or all of the dies. Several thermal models can be used, or a single thermal model with as many input and output can be used. The remaining life of the semiconductor power module is considered based on the health of the weakest die.

Figure 7:
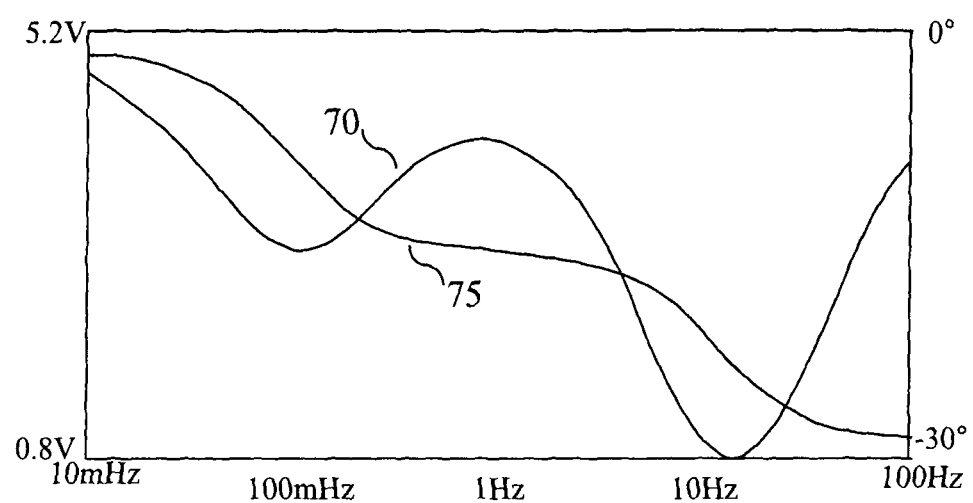
FIG. 7 represents an example of a frequency response of a thermal model of a power semiconductor module.

FIG. 7 represents an example of a frequency response of a thermal model of a power semiconductor module.

The horizontal axis represents the frequency and the vertical axis represents amplitude and phase.

The curves 75 and 70 show respectively variations of the amplitudes and of phases at different frequency.

As the thermal model has plural poles, the frequency response exhibits different areas where the parameters $\theta$ have different weights. It is possible to retrieve all the parameters $\theta$ by using at least as many frequency content of the signals.

The processor 400 updates the thermal model by determining a parameter vector $\theta$ which produces the smallest estimation error $\varepsilon(t, \theta) = Ymes(t) - Yest(t|\theta)$.

The parameter $\theta$ is the vector which comprises the different values of the thermal resistances and capacitors of the Cauer model.

The parameter vector $\theta$ may be for example determined with a least-square method. Several steps are necessary to perform this identification.

The processor 400 determines a first estimation error $\varepsilon(t, \theta)$, filters the estimation error in order to perform a frequency weighting, for example using a stable linear filter L(q): $\varepsilon_F(t, \theta) = L(q)\varepsilon(t, \theta)$, determines a norm, like for example a least mean square norm, $V_N(\theta) = 1/N*sum(t=1:N, l(\varepsilon_F(t, \theta)))$, where $l(.)$ is a scalar-valued (typically positive function), and N is the number of data samples. The processor 400 estimates the updated $\theta'$ by the minimization of $\theta' = arg\ min\ V_N(\theta)$, where arg min is the minimizing argument of the function.

For example, the processor 400 updates the thermal model by determining an updated parameter vector $\theta'$ with a statistical method such as the maximum likelihood method. At next step S508, the processor 400 analyses the thermal model obtained at step S507.

In one embodiment, the processor 400 compares the thermal model obtained at step S507 to a reference thermal model stored in the memory 403.

The reference thermal model is for example the initial thermal model that may be defined Off-line, for example during the commissioning of the power semiconductor module or by an initial identification at the beginning of the life of the power semiconductor module.

The updated values of the parameters of the thermal model are defined and compared. The thermal model comparison includes the steps of evaluating the error between the reference parameter values $\theta$ref at time t0 and the updated parameter values $\theta(t)$ at time t of the thermal model: err=$\theta$ref−$\theta(t)$, filtering the error, converting the filtered error into one or several distances. For example, one distance provides information on one failure mode. Typically, when a Cauer model is used, the parameters have a physical meaning, and one parameter may represent for example the thermal resistance of a particular solder layer while a second parameter may represent the thermal resistance of another layer, e.g. ceramic substrate. The evolution of the parameters is considered independently to distinguish between the failure modes.

In another embodiment, the distance between the reference and updated thermal model parameters is processed by an algorithm that can take different forms. For example, the processor 400 performs an extrapolation of the distance in order to define the time of the crossing point between the distance and a threshold value.

In this case, the history of the determined distances stored in memory is used. For example, a selection of the determined distances is used. The evolution of the selection of the determined distances can be fitted to a model of the typical evolution of the distance.

Typically, the present invention uses the estimation on the level and location of damage to predict the damage-propagation chain. For example, the increase of the thermal resistance between the baseplate and the DBC increases the thermal stress on the die attach, and thus accelerates its ageing. Thus, the present invention extrapolates a distance based on information on all the distances.

For example, an initial "establishment phase" where the parameters evolve quickly can be removed from the extrapolation.

The extrapolation is based on a model for determining the damage assessment of a power semiconductor module. The model can be physical or empirical, i.e. from data provided by other systems.

The model can be established beforehand using power cycling experiments on reference power semiconductor modules. The model can be updated during the operation of the product.

For example, the processor 400 compares the distances with threshold values, and if at least one of the distance is upper to a threshold, the processor 400 moves to step S510 in order to generate either a warning or remaining life estimation.

Important deviations from the reference model are used to locate the developing faults within the structure of the semiconductor power module. This information is then applied to the extrapolation model. The extrapolation model is thus able to predict the damage-propagation chain. The extrapolation model may be established beforehand from the reference power module through power cycling tests.

Thus, the fault propagation likelihood and the remaining lifetime are estimated with greater accuracy.

At step S510, the processor 400 commands the notification mean 407 in order to notify the level of damage of the power semiconductor module 10 or may command the notification mean 407 in order to notify a lifetime expectation of the power semiconductor module 10.

The notification can take the form of an electric signal that can be transmitted to the user or to the main controller of the product. This electric signal provides information on the apparition of a failure, or on the remaining time before failure.

Naturally, many modifications can be made to the embodiments of the invention described above without departing from the scope of the present invention.

The invention claimed is:

1. A method for estimating a level of damage or a lifetime expectation of a power semiconductor module comprising at least one die that is mechanically, thermally, and electrically attached to a substrate, composed of plural layers of different materials, comprising:
   obtaining iteratively during a given duration power losses of the power semiconductor module and a temperature in at least two different locations of the power semiconductor module,
   checking if the power losses obtained during the given duration are suitable for t a thermal model estimation,
   estimating a thermal model between the at least two different locations of the power semiconductor module using the determined power losses and the obtained temperatures only if power losses obtained during the given duration are suitable for the thermal model estimation by,
      parametrizing the thermal model using parameter values,
      determining an estimation error,
      filtering the estimation error,
      determining a norm of the estimation error, and
      selecting the parameter values which minimize the norm of the estimation error,
   determining if a notification indicating the level of damage or the lifetime expectation has to be performed according to the estimated thermal model and a reference thermal model, and
   notifying the level and location of damage or the lifetime expectation if the determining step determines that the notification has to be performed.

2. The method according to claim 1, wherein the locations at which the temperatures are obtained are at least a baseplate and a junction of at least one die.

3. The method according to claim 1, wherein the thermal model is a Cauer model.

4. The method according to claim 1, wherein the method comprises further step of determining when the level of damage or of the lifetime expectation of the power semiconductor module is estimated,
   wherein the level of damage or of the lifetime expectation of the power semiconductor module is estimated at fixed intervals,
   the level of damage or of the lifetime expectation of the power semiconductor module is estimated when a product comprising the power semiconductor module is turned-on,
   the level of damage or of the lifetime expectation of the power semiconductor module is estimated at a variable periodicity which depends on a previously determined lifetime expectation or
   the level of damage or of the lifetime expectation of the power semiconductor module is estimated when an electric power provided by the power semiconductor module changes abruptly or changes with a temperature.

5. The method according to claim 1, wherein the reference thermal model is determined during a commissioning of the power semiconductor module or by an initial identification at the beginning of the life of the power semiconductor module.

6. A method for estimating a level of damage or a lifetime expectation of a power semiconductor module comprising at least one die that is mechanically, thermally, and electrically attached to a substrate, composed of plural layers of different materials, comprising:
   obtaining iteratively during a given duration, power losses of the power semiconductor module and a temperature in at least two different locations of the power semiconductor module,
   checking if power losses obtained during the given duration are suitable for a thermal model estimation,
   estimating a thermal model between the at least two different locations of the power semiconductor module using the determined power losses and the obtained temperatures only if the power losses obtained during the given duration are suitable for the thermal model estimation
   determining if a notification indicating the level of damage or the lifetime expectation has to be performed according to the estimated thermal model and a reference thermal model by
   evaluating an error between reference parameter values parametrizing the reference thermal model and parameter values parametrizing the estimated thermal model,
   filtering the error, and
   converting the filtered error into one or several distances which is or are metrics for a deviation of the parameter values from the reference parameter values of the reference thermal model, and
   notifying the level and location of damage or the lifetime expectation if the determining step determines that the notification has to be performed.

7. The method according to claim 6, wherein the distances are extrapolated in order to define a time wherein the extrapolated distance is equal to a threshold value.

8. Device A device for estimating a level of damage or a lifetime expectation of a power semiconductor module comprising at least one die that is mechanically, thermally, and electrically attached to a substrate, composed of plural layers of different materials, the device comprising a processor configured to:
   obtain iteratively during a given duration power losses of the power semiconductor module and a temperature in at least two different locations of the power semiconductor module,
   check if the power losses obtained during the given duration are suitable for the thermal model estimation,
   estimate a thermal model between the at least two different locations of the power semiconductor module using the determined power losses and the obtained temperatures only if the power losses obtained during the given duration are suitable for the thermal model estimation by
      parametrizing the thermal model using parameter values,
      determining an estimation error,
      filtering the estimation error,
      determining a normal of the estimation error, and
      selecting the parameter values which minimize the norm of the estimation error,
   determine if a notification indicating the level of damage or the lifetime expectation has to be performed according to the estimated thermal model and a reference thermal model; and
   notify the level and location of damage or the lifetime expectation if it is determined that the notification has to be performed.

* * * * *